(12) United States Patent
Matsubara

(10) Patent No.: US 11,450,403 B1
(45) Date of Patent: Sep. 20, 2022

(54) SEMICONDUCTOR MEMORY DEVICE CAPABLE OF PERFORMING SOFT-POST-PACKAGE-REPAIR OPERATION

(71) Applicant: MICRON TECHNOLOGY, INC., Boise, ID (US)

(72) Inventor: Yasushi Matsubara, Isehara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/393,998

(22) Filed: Aug. 4, 2021

(51) Int. Cl.
  *G11C 29/02* (2006.01)
  *G11C 29/00* (2006.01)
(52) U.S. Cl.
  CPC .......... *G11C 29/787* (2013.01); *G11C 29/023* (2013.01); *G11C 29/027* (2013.01); *G11C 29/76* (2013.01); *G11C 29/789* (2013.01)
(58) Field of Classification Search
  CPC ... G11C 29/787; G11C 29/023; G11C 29/027; G11C 29/76; G11C 29/789
  See application file for complete search history.

(56) References Cited

U.S. PATENT DOCUMENTS

| | | | | |
|---|---|---|---|---|
| 2002/0064079 | A1* | 5/2002 | Sato | G11C 7/1045 365/227 |
| 2016/0300627 | A1* | 10/2016 | You | G11C 29/76 |
| 2017/0110206 | A1* | 4/2017 | Ryu | G11C 29/4401 |
| 2021/0166776 | A1* | 6/2021 | Wieduwilt | G11C 29/789 |

* cited by examiner

*Primary Examiner* — Mohammed A Bashar
(74) *Attorney, Agent, or Firm* — Dorsey & Whitney LLP

(57) ABSTRACT

Disclosed herein is an apparatus that includes a first address generator generating a first address in response to a clock signal; a second address generator generating a second address corresponding to the first address; a first detection circuit activating a first signal when the second address matches with a third address; a second detection circuit activating a second signal when the second address indicates a predetermined state; a first latch circuit latching the first address in response to the first signal; a second latch circuit latching the first address in response to the second signal; a third detection circuit activating a third signal when the first address matches with an address stored in the first latch circuit; a fourth detection circuit activating a fourth signal when the first address matches with an address stored in the second latch circuit; and a first selector selecting the third or fourth signal.

20 Claims, 13 Drawing Sheets

| FuseData_[6,0] | FBEn |
|---|---|
| FuseData[6,0]=(0,0) or, FuseData[6,0]=(1,1) FuseBank is not used for a repair | 0 |
| FuseData[6,0]=(0,1) or, FuseData[6,0]=(1,0) FuseBank is used for a repair | 1 |

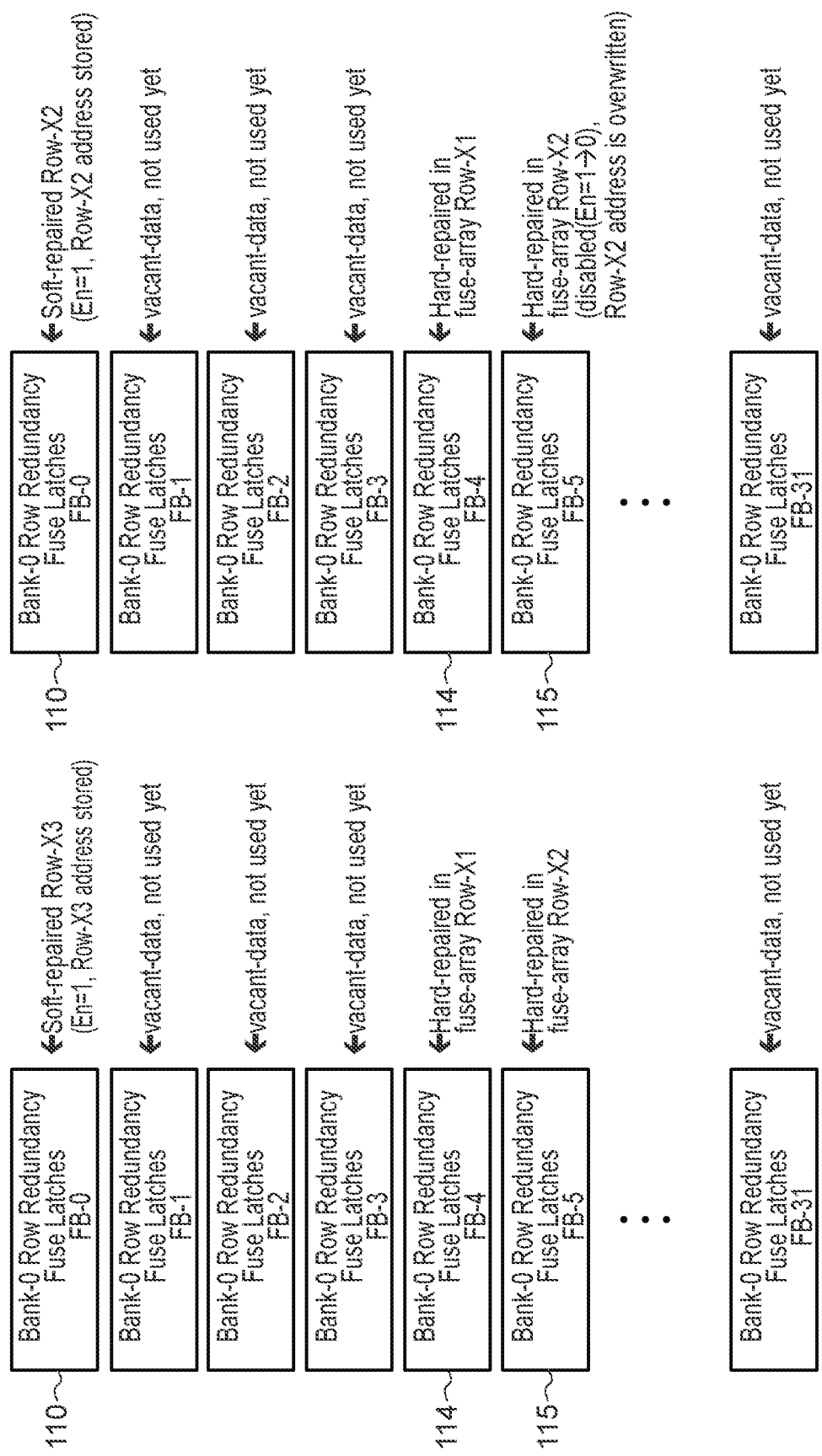

SEMICONDUCTOR MEMORY DEVICE CAPABLE OF PERFORMING SOFT-POST-PACKAGE-REPAIR OPERATION

BACKGROUND

In a semiconductor memory device such as a DRAM, a defective word or bit line is replaced with a spare word or bit line. The address of the defective word or bit line is stored in a nonvolatile storage circuit including a plurality of fuse elements or a plurality of anti-fuse elements. The address stored in the nonvolatile storage circuit is read out and transferred to a volatile address latch circuit when the semiconductor memory device is turned on. Writing of the address to the nonvolatile storage circuit is performed in a manufacturing stage of the semiconductor memory device. Replacement using the nonvolatile storage circuit is called a hard-post-package repair.

Some semiconductor memory devices in recent years are configured to be repairable by a soft-post-package repair in addition to the hard-post-package repair. The soft-post-package repair is an operation of writing an address directly to the volatile address latch circuit by issuing a soft-post-package-repair command. In the semiconductor memory device capable of being repaired by a soft-post-package repair, it is desirable that a soft-post-package-repair Undo command to cancel the soft-post-package repair and a Lock command to prohibit execution of the Undo command are acceptable.

BRIEF DESCRIPTION OF THE DRAWINGS

FIG. 11A and FIG. 11B are block diagrams showing an example of a state of the address latch circuit after a soft-post-package repair.

DETAILED DESCRIPTION

Various embodiments of the present invention will be explained below in detail with reference to the accompanying drawings. The following detailed description refers to the accompanying drawings that show, by way of illustration, specific aspects, and embodiments in which the present invention may be practiced. These embodiments are described in sufficient detail to enable those skilled in the art to practice the present invention. Other embodiments may be utilized, and structural, logical, and electrical changes may be made without departing from the scope of the present invention. The various embodiments disclosed herein are not necessary mutually exclusive, as some disclosed embodiments can be combined with one or more other disclosed embodiments to form new embodiments.

1. Circuit Configuration

Figure 1:
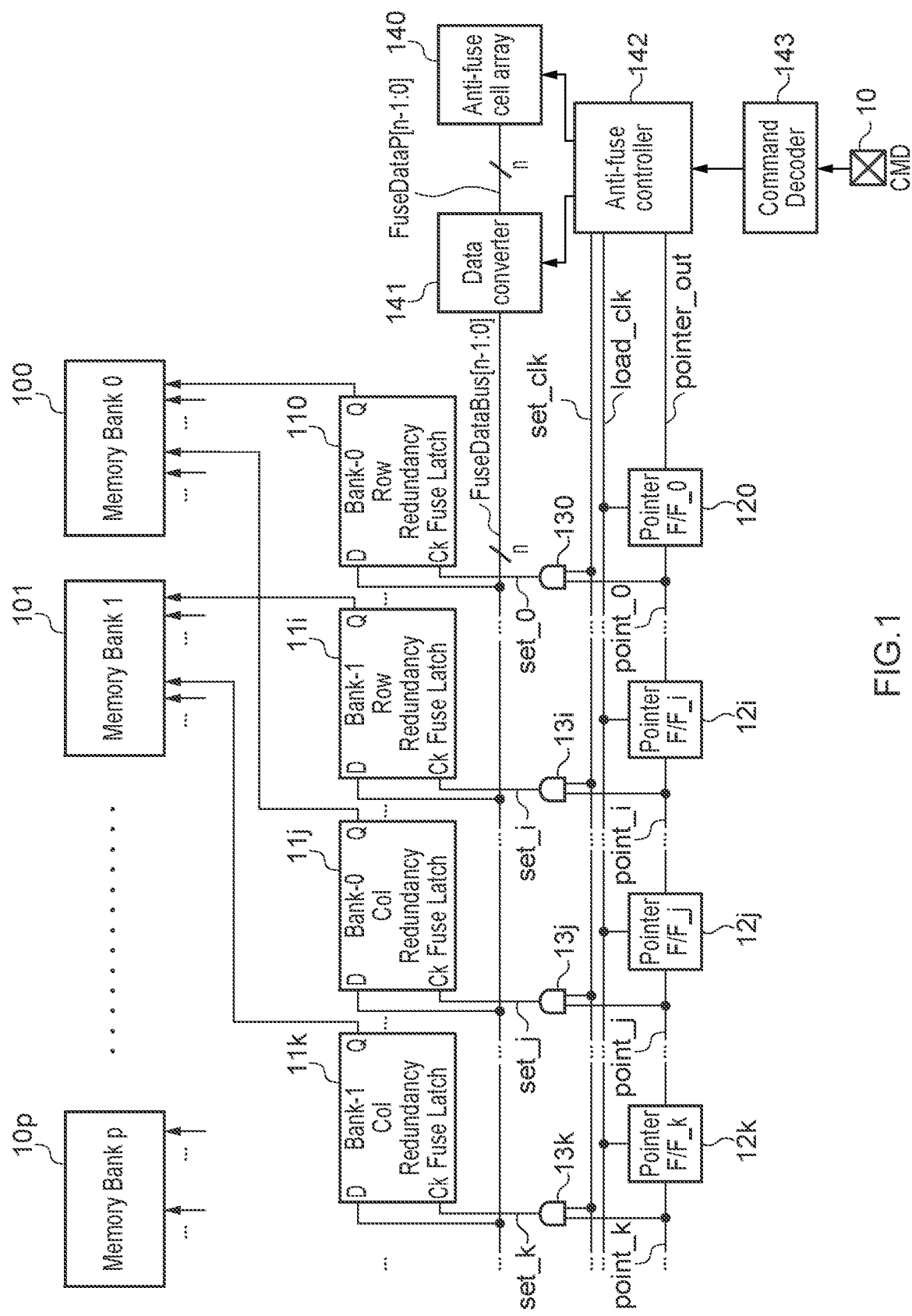
FIG. 1 is a block diagram showing a configuration of a semiconductor memory device according to the present disclosure.

FIG. 1 is a block diagram showing a configuration of a semiconductor memory device according to the present disclosure. As shown in FIG. 1, the semiconductor memory device according to the present disclosure includes a plurality of memory banks 100, 101, . . . , 10p. Each memory bank includes a plurality of memory cells each of which can be selected by a word line and a bit line. Each memory bank includes regular word lines and regular bit lines and also includes spare word lines and spare bit lines. Accordingly, a defective word line is replaced with a spare word line and a defective bit line is replaced with a spare bit line. The row address of the defective word line or the column address of the defective bit line is stored in an anti-fuse cell array 140. Fuse data FuseDataP[n−1:0] output from the anti-fuse cell array 140 is transferred to a fuse data bus via a data converter 141. Operations of the anti-fuse cell array 140 and the data converter 141 are controlled by an anti-fuse controller 142. The anti-fuse controller 142 is started at the time of initialization after power is turned on, and is also started when a command signal CMD input to a command decoder 143 via a command terminal 10 indicates a soft-post-package-repair command or a soft-post-package-repair Undo command.

When the anti-fuse controller 142 is started, addresses stored in the anti-fuse cell array 140 are sequentially transferred to the fuse data bus and, in conjunction with this transfer, a set clock set_clk and a load clock load_clk perform clocking. The fuse data FuseDataP[n−1:0] on the fuse data bus is supplied to a plurality of address latch circuits 110, . . . 11i, . . . , 11j, . . . 11k, . . . in common. The address latch circuit 110 is assigned to the memory bank 100 and stores therein the row address of a defective word line included in the memory bank 100. There are also a plurality of address latch circuits for row address assigned to the memory bank 100, other than the address latch circuit 110. The address latch circuit 11j is assigned to the memory bank 100 and stores therein the column address of a defective bit line included in the memory bank 100. There are also a plurality of address latch circuits for column address assigned to the memory bank 100, other than the address latch circuit 11j. The address latch circuit 11i is assigned to the memory bank 101 and stores therein the row address of a defective word line included in the memory bank 101. There are also a plurality of address latch circuits for row address assigned to the memory bank 101, other than the address latch circuit 11i. The address latch circuit 11k is assigned to the memory bank 101 and stores therein the column address of a defective bit line included in the memory bank 101. There are also a plurality of address latch circuits for column address assigned to the memory bank 101, other than the address latch circuit 11k.

Figure 2:
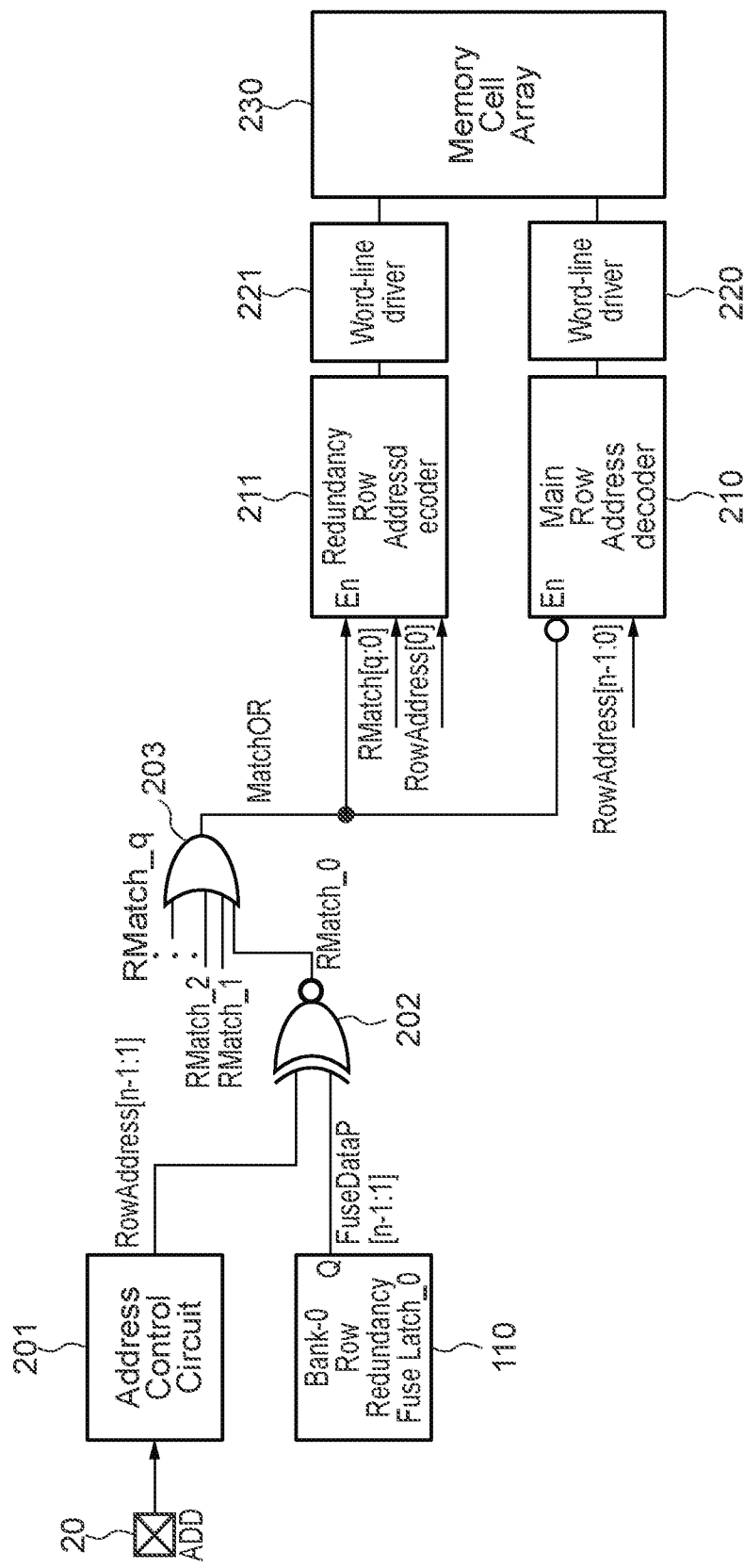
FIG. 2 is a block diagram showing a configuration of a main portion of a memory bank.

FIG. 2 is a block diagram showing a configuration of a main portion of each memory bank. As shown in FIG. 2, an address ADD input to an address terminal 20 is supplied to an address control circuit 201. A row address [n−1:1] of the supplied address and fuse data FuseDataP[n−1:1] stored in the address latch circuit 110 are compared with each other by a comparison circuit 202. When they match with each other, a match signal RMatch_0 is activated. In addition to the address latch circuit 110, q address latch circuits are assigned to the memory bank 100. When any of the fuse data FuseDataP[n−1:1] stored in these address latch circuits matches with the row address [n−1:1], a corresponding one of match signals RMatch_1 to RMatchq is activated. The match signals RMatch_0 to RMatchq are input to an OR gate circuit 203. Accordingly, when any of the match signals RMatch_0 to RMatchq is activated, a match signal MatchOR is activated. The match signal MatchOR is supplied to a main row address decoder 210 and a redundancy row address decoder 211. The main row address decoder 210 is selected when the match signal MatchOR is inactive, and decodes the row address [n−1:0] to drive a word-line driver 220. Consequently, any one of regular word lines included in a memory cell array 230 is selected. The redundancy row address decoder 211 is selected when the match signal MatchOR is active, and drives a word-line driver 221 based on the match signals RMatch_0 to RMatchq and a row address [0]. Consequently, any of spare word lines included in the memory cell array 230 is selected. This description is also applied to column addresses. Fuse data stored in the address latch circuits 11j, . . . shown in FIG. 1 and a column address input from outside are compared with each other, a regular bit line is selected when they do not match with each other, and a spare bit line is selected when they match with each other.

Figure 3:
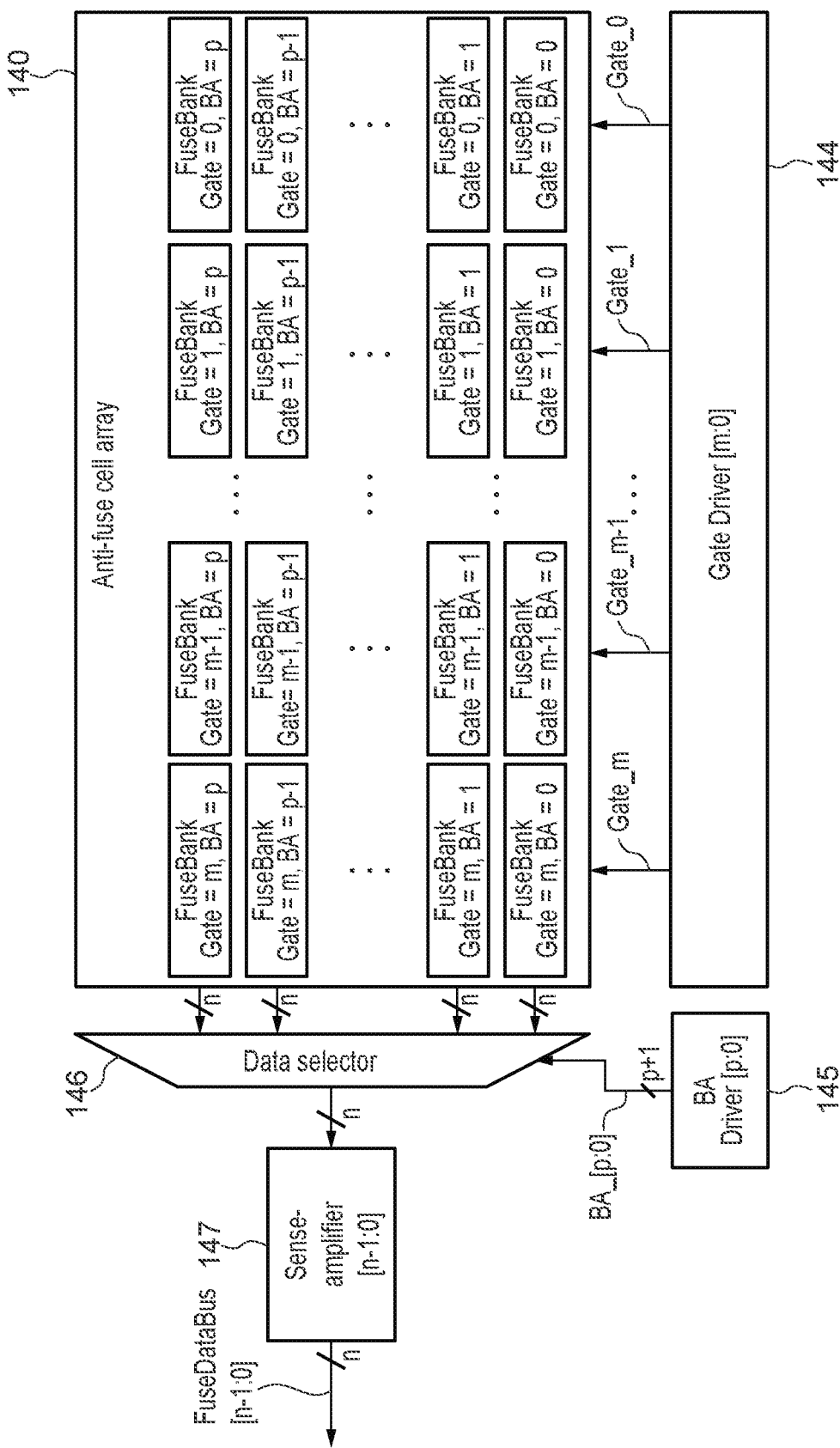
FIG. 3 is a block diagram showing a configuration of an anti-fuse cell array.

FIG. 3 is a block diagram showing a configuration of the anti-fuse cell array 140. As shown in FIG. 3, the anti-fuse cell array 140 includes a plurality of fuse banks. Each fuse bank is configured by a plurality of anti-fuse elements to which writing is performed in a manufacturing stage of a semiconductor memory device. To each of (p+1) memory banks, (m+1) fuse banks are assigned. In the anti-fuse cell array 140, when any of gate signals Gate_0 to Gate_m supplied from a gate driver 144 is activated, (p+1) fuse banks corresponding to that gate signal are selected at the same time, and the fuse data FuseDataP[n−1:0] stored in the selected fuse banks is supplied to a data selector 146. The data selector 146 selects any of the fuse data FuseDataP[n−1:0] based on bank signals BA_0 to BA_p supplied from a bank driver 145 and supplies the selected data to a sense amplifier 147. The sense amplifier 147 amplifies the amplitude of the fuse data FuseDataP[n−1:0] supplied thereto to a CMOS level and outputs the fuse data with the amplified amplitude to a fuse data bus.

Figure 4A:
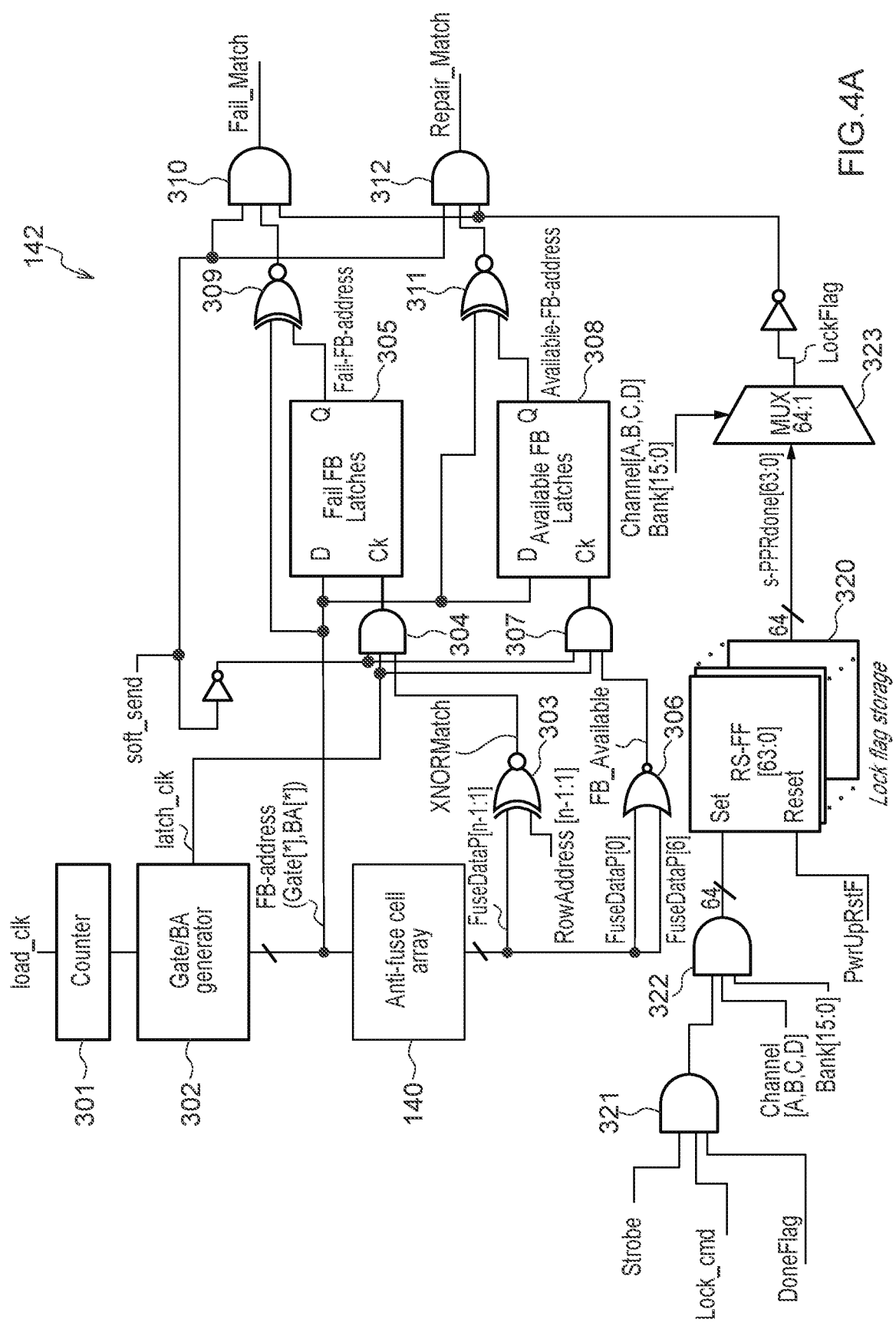
FIG. 4A and FIG. 4B are circuit diagrams showing a configuration of a main portion of an anti-fuse controller.

FIG. 4A is a circuit diagram showing a configuration of a main portion of the anti-fuse controller 142. As shown in FIG. 4A, the anti-fuse controller 142 includes a counter circuit 301 that performs a counting operation in response to the load clock load_clk and an address generator 302 that generates a fuse bank address FB based on a count value of the counter circuit 301. The fuse bank address FB is composed of one of the above-described gate signals Gate_0 to Gate_m and one of the above-described bank signals BA_0 to BA_p. Therefore, every time the load clock load_clk is activated, the fuse data FuseDataP[n−1:0] stored in a fuse bank specified by the fuse bank address FB is sequentially output from the anti-fuse cell array 140. The anti-fuse cell array 140 is a second address generator that outputs the fuse data FuseDataP[n−1:0] based on the fuse bank address FB. This anti-fuse_read operation is performed twice in each of a soft-post-package-repair operation and a soft-post-package-repair Undo operation that will be described later. A soft-post-package-repair signal soft_send becomes low in the first anti-fuse_read operation, and becomes high in the second anti-fuse_read operation.

The fuse data FuseDataP[n−1:1] and the row address [n−1:1] input from outside are compared with each other by a comparison circuit 303 that is a first detection circuit. When they match with each other, a match signal XNORMatch is activated. This operation is performed for detecting, in a soft-post-package-repair operation, whether an address for which a soft-post-package repair is to be performed has been already repaired by a hard-post-package repair and for detecting, in a soft-post-package-repair Undo operation, whether an address for which a soft-post-package repair is to be canceled is a target of a hard-post-package repair. The match signal XNORMatch is supplied to a clock node of a latch circuit 305 via an AND gate circuit 304. Accordingly, in a case where the address for which a soft-post-package repair is to be performed has been already repaired by a hard-post-package repair and a case where the address for which a soft-post-package repair is to be canceled is a target of a hard-post-package repair, the fuse bank address FB used for the hard-post-package repair is latched by the latch circuit 305 in the first anti-fuse_read operation.

Further, fuse data FuseDataP[0] and fuse data FuseDataP[6] are input to a NOR gate circuit 306 that is a second detection circuit. The fuse data FuseDataP[0] is an enable bit and, when the corresponding fuse data FuseDataP[n−1:1] is used, is set to an inverted level of the fuse data FuseDataP[6]. Therefore, a detection signal FB_Available output from the NOR gate circuit 306 is low when the corresponding fuse data FuseDataP[n−1:1] is used, and is high when the corresponding fuse data FuseDataP[n−1:1] is unused. The detection signal FB_Available is supplied to a clock node of a latch circuit 308 via an AND gate circuit 307. Accordingly, in the first anti-fuse_read operation, the fuse bank address FB of an unused fuse bank is latched by the latch circuit 308.

An address signal Fall-FB-address output from the latch circuit 305 is compared with a current fuse bank address FB by a comparison circuit 309 that is a third detection circuit. An output signal of the comparison circuit 309, the soft-post-package-repair signal soft_send, and an inverted signal of a lock flag LockFlag are input to an AND gate circuit 310. The AND gate circuit 310 activates a match signal Fail_Match when the output signal of the comparison circuit 309, the soft-post-package-repair signal soft_send, and the inverted signal of the lock flag LockFlag are all at a high level. Accordingly, in the second anti-fuse_read operation, when the fuse bank address FB output from the address generator 302 matches with the fuse bank address FB latched by the latch circuit 305, the match signal Fail_Match is activated. The match signal Fail_Match is activated at the timing when a fuse bank storing therein the same address as an address for which a soft-post-package-repair is to be performed is selected in a soft-post-package-repair operation, and is also activated at the timing when a fuse bank storing therein the same address as an address for which a soft-post-package repair is to be canceled is selected in a soft-post-package-repair Undo operation.

An address signal Available-FB-address output from the latch circuit 308 is compared with the current fuse bank address FB by a comparison circuit 311 that is a fourth detection circuit. An output signal of the comparison circuit 311, the soft-post-package-repair signal soft_send, and inverted signal of the lock flag LockFlag are input to an AND gate circuit 312. The AND gate circuit 312 activates a match signal Repair_Match when all the signals input thereto are high. Accordingly, in the second anti-fuse_read operation, when the fuse bank address FB output from the address generator 302 matches with the fuse bank address FB latched by the latch circuit 308, the match signal Repair_Match is activated. The match signal Repair_Match is activated at the timing when an address latch circuit to be used for a soft-post-package repair is selected in a soft-post-package-repair operation, and is also activated at the timing when an address latch circuit for which a soft-post-package repair is to be canceled is selected in a soft-post-package-repair Undo operation.

Figure 4B:
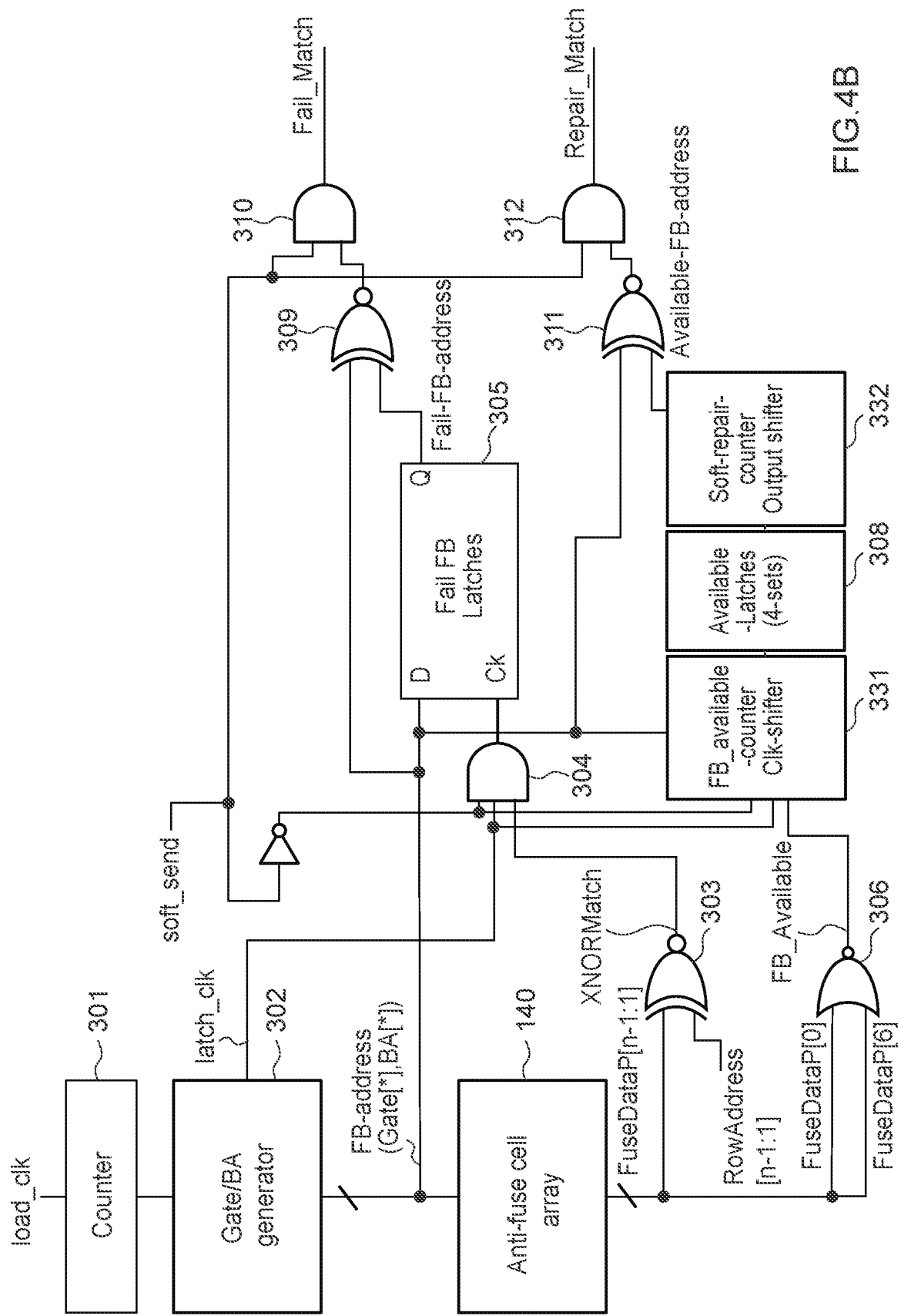

The anti-fuse controller 142 further includes a plurality of lock flags 320. The lock flags 320 are provided for respective banks. For example, in a case where the semiconductor memory device according to the present embodiment is divided into four channels A to D each including 16 memory banks, 64 lock flags 320 in total are provided. The lock flags 320 are all reset by a power-on reset signal PwrUpRstF that is activated when power is turned on. When a lock signal Lock_cmd is activated at the time of issuance of a lock command, a lock flag 320 for the corresponding channel and the corresponding memory bank are set in response to a strobe signal via AND gate circuits 321 and 322. However, since a history signal DoneFlag described later is input to the AND gate circuit 321, the lock signal Lock_cmd is disabled when the history signal DoneFlag is inactive. A flag s-PPR-doce[63:0] written to the lock flag 320 is selected by a multiplexer 323, and is used as the lock flag LockFlag for the corresponding channel and the corresponding memory bank. FIG. 4B will be explained below in relation to performing a plurality of soft-post-package repairs for one memory bank.

Figure 5:
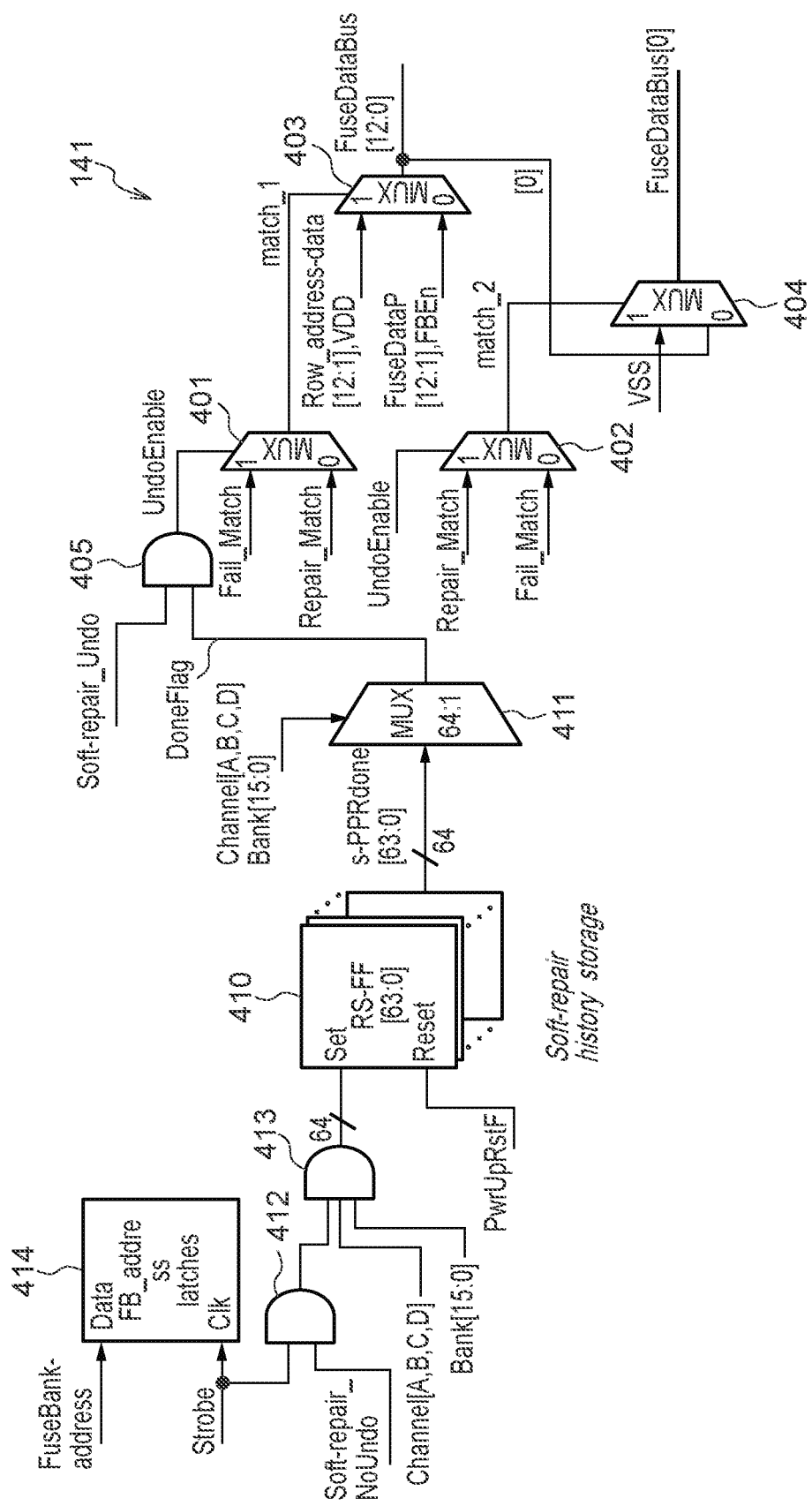
FIG. 5 is a circuit diagram showing a configuration of a main portion of a data converter.

FIG. 5 is a circuit diagram showing a configuration of a main portion of a data converter. As shown in FIG. 5, the data converter 141 includes multiplexers 401 and 402 each of which is a selector selecting either one of the match signals Fail_Match and Repair_Match. The multiplexer 401 selects the match signal Repair_Match when an enable signal UndoEnable is inactive, and selects the match signal Fail_Match when the enable signal UndoEnable is active. On the other hand, the multiplexer 402 selects the match signal Fail_Match when the enable signal UndoEnable is inactive, and selects the match signal Repair_Match when the enable signal UndoEnable is active.

A match signal match_1 output from the multiplexer 401 is used as a selection signal of a multiplexer 403. The multiplexer 403 selects fuse data FuseDataP[12:1], FBEn when the match signal match_1 is inactive, and selects a row address [12:1], VDD input from outside when the match signal match_1 is active. The selected data is output to a fuse data bus [12:0]. The fuse data FuseDataP[12:1], FBEn means that an enable signal FBEn is used as a value of the fuse data FuseDataP[0] that is an enable bit. Further, the row address [12:1], VDD means that a value of the row address [0] as an enable bit is fixed to an active level. Accordingly, in a soft-post-package-repair operation, the row address [12:1], VDD input from the outside is transferred to the fuse data bus at the timing when the match signal Repair_Match is activated. In a soft-post-packager-repair Undo operation, the row address [12:1], VDD input from the outside is transferred to the fuse data bus at the timing when the match signal Fail_Match is activated. A match signal match_2 output from the multiplexer 402 is used as a selection signal of a multiplexer 404. The multiplexer 404 outputs the least significant bit [0] output from the multiplexer 403 to a fuse data bus [0] as it is when the match signal match_2 is inactive, and fixes a value of its output to the fuse data bus [0] to a VSS level when the match signal match_2 is active.

Accordingly, in a soft-post-package-repair operation, a value of the row address [0] as an enable bit is fixed to the VSS level at the timing when the match signal Fail_Match is activated. In a soft-post-package-repair Undo operation, the value of the row address [0] as an enable bit is fixed to the VSS level at the timing when the match signal Repair_Match is activated.

Figures 6A, 6B:
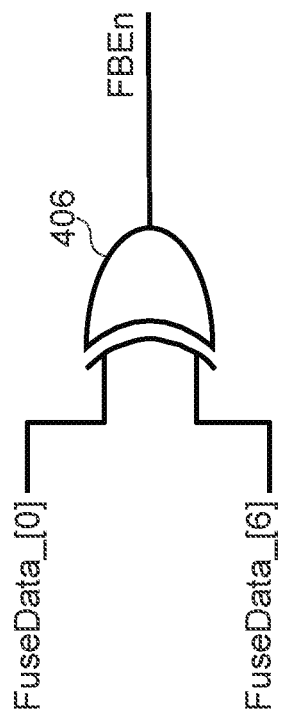
FIG. 6A is a circuit diagram of a circuit that generates an enable signal.
FIG. 6B is a truth table of the circuit shown in FIG. 6A.

FIG. 6A is a circuit diagram of a circuit that generates an enable signal. As shown in FIG. 6A, the enable signal FBEn is generated by an exclusive OR circuit 406 that receives the fuse data FuseDataP[0] and FuseDataP[6]. Therefore, as shown in FIG. 6B, when logical values of the fuse data FuseDataP[0] and FuseDataP[6] match with each other, the enable signal FBEn becomes low (FBEn=0). When the logical values of the fuse data FuseDataP[0] and FuseDataP[6] do not match with each other, the enable signal FBEn becomes high (FBEn=1). Here, the fuse data FuseDataP[0] is an enable bit, and is set to an inverted level of the fuse data FuseDataP[6] when the corresponding fuse data FuseDataP[n−1:1] is used.

Referring back to FIG. 5, the enable signal UndoEnable is generated by an AND gate circuit 405 that receives a soft-post-package-repair Undo signal Soft-repair_Undo and the history signal DoneFlag. The soft-post-package-repair Undo signal Soft-repair_Undo is activated when a soft-post-package-repair Undo command is issued. The history signal DoneFlag is a signal selected from output signals of a plurality of history flags 410 by a multiplexer 411. The history flags 410 are provided for respective banks. For example, in a case where the semiconductor memory device according to the embodiment is divided into four channels A to D each including 16 memory banks, 64 history flags 410 in total are provided. The history flags 410 are all reset by the power-on reset signal PwrUpRstF that is activated when power is turned on. When a soft-post-package-repair signal Soft-repair_NoUndo is activated at the time of issuance of a soft-post-package-repair command, the history flag 410 for the corresponding channel and the corresponding memory bank is set in response to a strobe signal via AND gate circuits 412 and 413. The strobe signal is also supplied to a latch circuit 414. The latch circuit 414 latches the fuse bank address FB in response to the strobe signal.

2. Fuse Data Broadcast

When the semiconductor memory device according to the present disclosure is turned on, an initializing operation is performed. The initializing operation includes Fuse Data Broadcast that is an operation of transferring a plurality of pieces of fuse data FuseDataP[n−1:0] stored in the anti-fuse cell array 140 to the address latch circuits 110, . . . 11i . . . 11j, . . . 11k, . . . to perform a hard-post-package repair.

Figure 7:
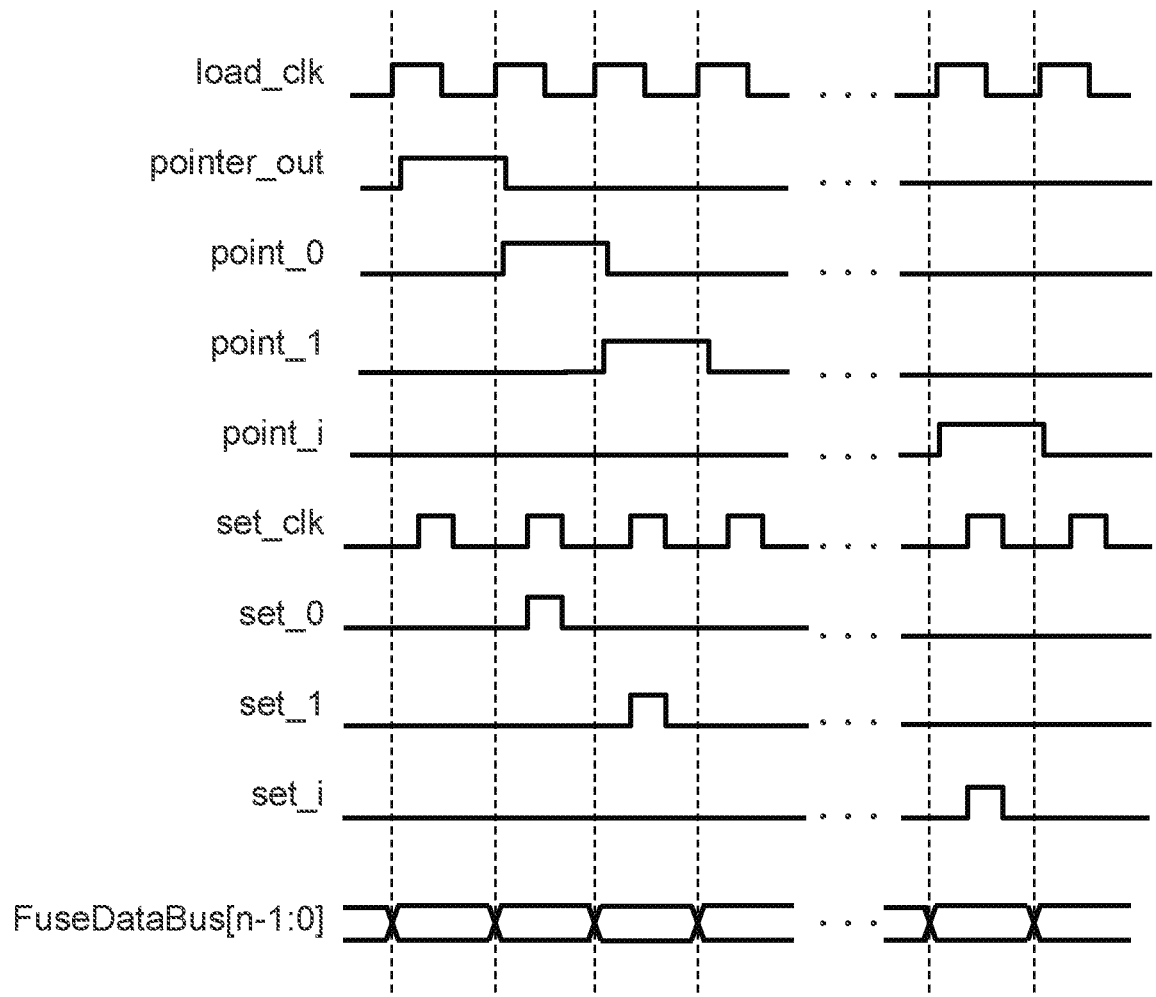
FIG. 7 is a timing chart for explaining Fuse Data Broadcast.

FIG. 7 is a timing chart for explaining Fuse Data Broadcast. As shown in FIG. 7, during Fuse Data Broadcast, the anti-fuse controller 142 toggles the load clock load_clk and outputs a one-short pointer signal pointer out. When the load clock load_clk is toggled, a count value of the counter circuit 301 shown in FIG. 4A is incremented or decremented and, in response to this increment or decrement, the address generator 302 sequentially changes the fuse bank address FB. When the fuse bank address FB is sequentially changed, the fuse data FuseDataP[n−1:0] corresponding thereto is sequentially output from the anti-fuse cell array 140. The fuse data FuseDataP[12:1] of the output data is output to the fuse data bus [12:1] via the multiplexer 403 shown in FIG. 5. The enable signal FBEn is supplied to the fuse data bus [0].

The load clock load_clk is supplied to clock nodes of pointer circuits 120, . . . 12*i*, . . . 12*j*, . . . 12*k*, . . . connected in cascade connection in common. The pointer circuits 120, . . . 12*i*, . . . 12*j*, . . . 12*k*, . . . are assigned to the address latch circuits 110, . . . 11*i*, . . . 11*j*, . . . 11*k*, . . . , respectively. The pointer signal pointer out is input to the pointer circuit 120 in the first stage. Accordingly, pointer signals point_0, point_1, . . . are sequentially activated in synchronization with the load clock load_clk. The anti-fuse controller 142 further outputs the set clock set_clk delayed from the load clock load_clk. The set clock set_clk is supplied to one input nodes of AND gate circuits 130, . . . 13*i*, . . . 13*j*, . . . 13*k*, . . . in common. To the other input nodes of the AND gate circuits 130, . . . 13*i*, . . . 13*j*, . . . 13*k*, . . . , the corresponding pointer signals point_0, . . . point_i, . . . point_j, . . . point_k, . . . are supplied, respectively. Accordingly, set signals set_0, . . . set_i, . . . set_j, . . . set_k, . . . , respectively output from the AND gate circuits 130, . . . 13*i*, . . . 13*j*, . . . 13*k*, . . . are sequentially activated.

The set signals set_0, . . . set_i, . . . set_j, . . . set_k, . . . are input to clock nodes of the corresponding address latch circuits 110, . . . 11*j*, . . . 11*k*, . . . , respectively. Data input nodes of the address latch circuits 110, . . . 11*i*, . . . 11*j*, . . . 11*k*, . . . are connected to a fuse data bus in common. The fuse data FuseDataP[n−1:0] on the fuse data bus is sequentially changed in synchronization with the load clock load_clk, as described referring to FIG. 4A, and is latched by the corresponding address latch circuits 110, . . . 11*i*, . . . 11*j*, . . . 11*k*, . . . in response to the set signals set_0, . . . set_i, . . . set_j, . . . set_k, respectively. In this manner, the address of a defective word line and the address of a defective bit line are latched by the address latch circuits 110, . . . 11*i*, . . . 11*j*, . . . 11*k*, . . . , so that a hard-post-package repair is completed. When access to the defective word or bit line is requested, access is made to a spare word or bit line in place of the defective word or bit line.

Figure 8:
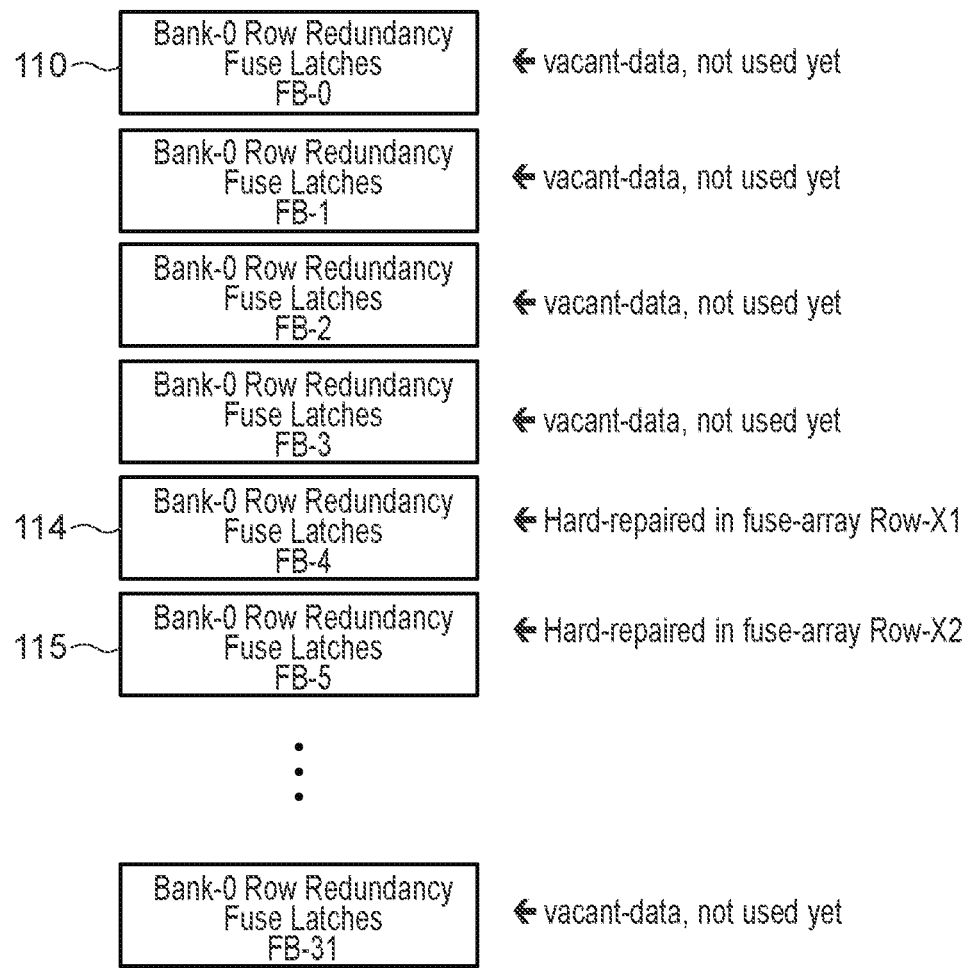
FIG. 8 is a schematic diagram showing an example of a state of an address latch circuit after a hard-post-package repair.

When the hard-post-package repair is completed, the address of the defective word line and the address of the defective bit line are latched by some address latch circuits, as shown in FIG. 8. FIG. 8 shows 32 address latch circuits corresponding to row addresses of the memory bank 100. In these row addresses, row addresses Row-X1 and Row-X2 stored at fuse bank addresses FB-4 and FB-5 are latched by address latch circuits 114 and 115, respectively.

3-1. Soft-Post-Package-Repair Operation (without Fail_Match)

A soft-post-package-repair operation is performed by inputting a soft-post-package-repair command to the command terminal 10 shown in FIG. 1 and inputting an address signal indicating an address for which a soft-post-package repair is to be performed to the address terminal 20 shown in FIG. 2.

Figure 9:
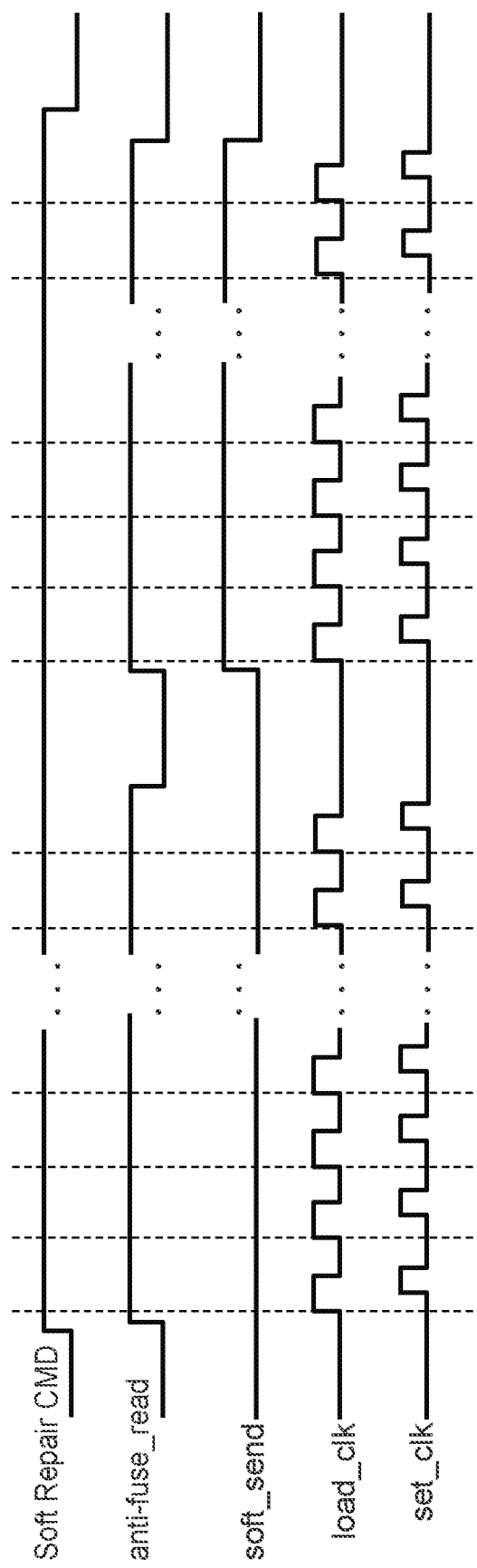
FIG. 9 is a timing chart for explaining a soft-post-package-repair operation.

FIG. 9 is a timing chart for explaining a soft-post-package-repair operation. As shown in FIG. 9, when a soft-post-package-repair command is input, an anti-fuse_read operation is performed twice. In the anti-fuse_read operation, the load clock load_clk and the set clock set_clk are toggled. In the first anti-fuse_read operation, the soft-post-package-repair signal soft_send is inactive and thus an operation identical to Fuse Data Broadcast is performed. In the second anti-fuse_read operation, the soft-post-package-repair signal soft_send is active. Unlike Fuse Data Broadcast, the set clock set_clk may be output at the timing when the match signal Fail_Match or the match signal Repair_Match is activated. That is, while the match signal Fail_Match and the match signal Repair_Match are inactive, the toggle of the set clock set_clk may be stopped.

Figure 10:
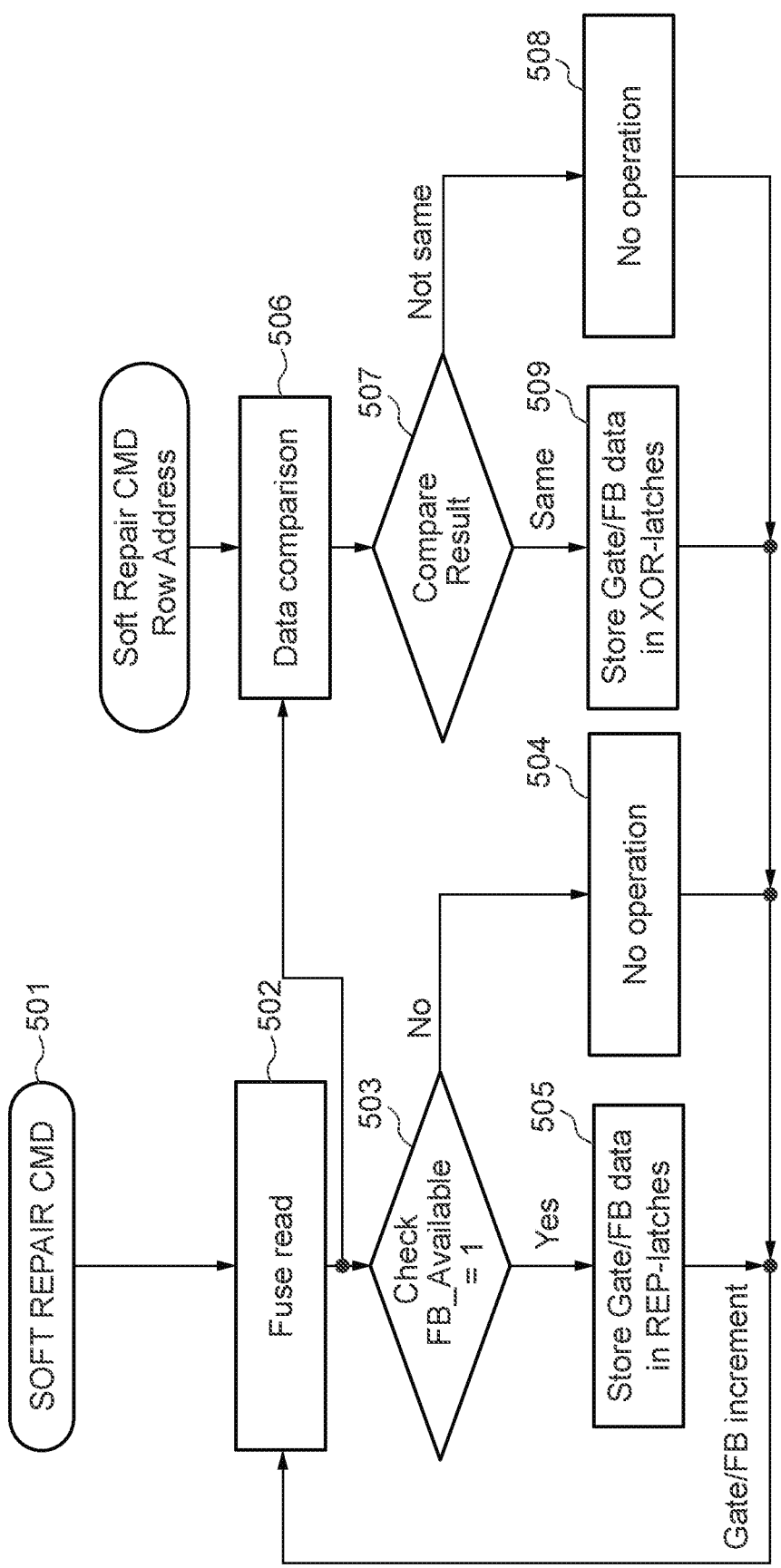
FIG. 10 is a flowchart for explaining a soft-post-package-repair operation.

FIG. 10 is a flowchart for explaining a soft-post-package-repair operation. As shown in FIG. 10, when a soft-post-package-repair command is input (Step 501), the anti-fuse controller 142 toggles the load clock load_clk. Accordingly, a count value of the counter circuit 301 shown in FIG. 4A is incremented or decremented, and the address generator 302 sequentially changes the fuse bank address FB. When the fuse bank address FB is sequentially changed, the fuse data FuseDataP[n−1:0] corresponding thereto is sequentially output from the anti-fuse cell array 140 (Step 502). The fuse data FuseDataP[0] and the fuse data FuseDataP[6] included in the fuse data FuseDataP[n−1:0] are input to the NOR gate circuit 306. The NOR gate circuit 306 activates the detection signal FB_Available when both the fuse data FuseDataP[0] and the fuse data FuseDataP[6] are low (Step 503). Accordingly, when the fuse data FuseDataP[n−1:0] currently output from the anti-fuse cell array 140 is unused, the detection signal FB_Available is activated. When the detection signal FB_Available is inactive, additional processing is not performed (Step 504). When the detection signal FB_Available is active, the current fuse bank address FB is latched by the latch circuit 308 (Step 505). The first anti-fuse_read operation is ended when these operations are performed until all the fuse bank addresses FB are read out.

The second anti-fuse_read operation is the same as the first anti-fuse_read operation except that the soft-post-package-repair signal soft_send is active. In the second anti-fuse_read operation, the fuse bank address FB latched by the latch circuit 308 and the current fuse bank address FB are compared with each other by the comparison circuit 311 and, when they match with each other, the match signal Repair_Match is output from the AND gate circuit 312.

The match signal Repair_Match is selected by the multiplexer 401 shown in FIG. 5 and is output as the match signal match_1. The match signal match_1 is a selection signal of the multiplexer 403. When this signal is inactive, the fuse data FuseDataP[12:1] is output to the fuse data bus [12:1]. When this signal is active, the row address [12:1] input from outside is output to the fuse data bus [12:1]. Accordingly, at the timing when an unused fuse bank address FB is selected, the row address [12:1] input from the outside is output to the fuse data bus [12:1], and is latched by a corresponding address latch circuit in response to the set clock set_clk. At this time, if the match signal Fail_Match is inactive, the fuse data FuseDataP[0] is output to the fuse data bus [0] as it is via the multiplexer 404. Since the row address [0] is fixed to a VDD level as shown in FIG. 5, the fuse data bus [0] that transmits an enable bit is at the VDD level.

When the soft-post-package repair is completed, the address of a defective word or bit line is additionally latched by an address latch circuit that has not been used for a hard-post-package repair as shown in FIG. 11A. In the example shown in FIG. 11A, the row address Row-X3 has been latched by the address latch circuit 110 by a soft-post-package repair. Except for this point, the state in FIG. 11A is the same as the state shown in FIG. 8. As described above, when a soft-post-package-repair command is executed, any address can be added to an unused address latch circuit.

Further, when the soft-post-package repair is performed, the history flag 410 shown in FIG. 5 is set. Accordingly, with respect to a memory bank for which the soft-post-package repair has been performed, the history signal DoneFlag becomes active.

Furthermore, another configuration may be employed as a modification shown in FIG. 4B, in which four latch circuits 308, for example, are provided, one of the latch circuits 308 that latches the fuse bank address FB is selected by a counter circuit 331, and one of the latch circuits 308 that outputs the fuse bank address FB to the comparison circuit 311 is selected by a counter circuit 332. With this configuration, it is possible to perform a plurality of soft-post-package repairs for one memory bank.

3-2. Soft-Post-Package-Repair Operation (with Fail_Match)

In a case where an address for which a soft-post-package repair is to be performed has been already repaired by a hard-post-package repair, an operation of disabling an address latch circuit for which the hard-post-package repair has been done is added in the soft-post-package-repair operation described above. As shown in FIG. 10, in the first anti-fuse_read operation, the address for which a soft-post-package repair is to be performed and the fuse data FuseDataP[n−1:1] read out from the anti-fuse cell array 140 are compared with each other by the comparison circuit 303 (Step 506). When they match with each other, the comparison circuit 303 activates the match signal XNORMatch (Step 507). When the match signal XNORMatch is inactive, additional processing is not performed (Step 508). When the match signal XNORMatch is active, the current fuse bank address FB is latched by the latch circuit 305 (Step 509).

In the second anti-fuse_read operation, the fuse bank address FB latched by the latch circuit 305 and the current fuse bank address FB are compared with each other by the comparison circuit 309. When the fuse bank address FB latched by the latch circuit 305 and the current fuse bank address FB match with each other, the match signal Fail_Match is output from the AND gate circuit 310.

The match signal Fail_Match is selected by the multiplexer 402 shown in FIG. 5 and is output as the match signal match_2. The match signal match_2 is a selection signal of the multiplexer 404. When this signal is inactive, the fuse data FuseDataP[0] is output to the fuse data bus [0] as it is. When this signal is active, the fuse data bus [0] is fixed to a VSS level. That is, at the timing when the match signal Fail_Match is activated, the fuse data bus [0] that transmits an enable bit is placed at the VSS level.

As a result, as shown in FIG. 11B, a selected address latch circuit is disabled at the timing when the match signal Fail_Match is activated. In the example shown in FIG. 11B, an enable bit of the row address Row-X2 latched by the address latch circuit 115 is overwritten to a VSS level, so that the address latch circuit 115 is disabled. Instead, the row address Row-X2 is latched by the address latch circuit 110. As described above, in a case where an address for which a soft-post-package repair is to be performed has been already repaired by a hard-post-package repair, the hard-post-package repair is canceled and a soft-post-package repair is performed for another address latch circuit.

4-1. Soft-Post-Package-Repair Undo Operation (without Fail_Match)

A soft-post-package-repair Undo operation is performed by inputting a soft-post-package-repair Undo command to the command terminal 10 shown in FIG. 1 and inputting an address signal indicating an address for which a soft-post-package repair is to be canceled to the address terminal 20 shown in FIG. 2.

A soft-post-package-repair Undo operation in the anti-fuse controller 142 is basically the same as a soft-post-package-repair operation. Therefore, the detection signal FB_Available is generated in accordance with the flowchart shown in FIG. 10 (Step 503). Accordingly, in the first anti-fuse_read operation, the fuse bank address FB that is the same as the fuse bank address FB selected in a soft-post-package repair is latched by the latch circuit 308 (Step 505). In the second anti-fuse_read operation, the fuse bank address FB latched by the latch circuit 308 and the current fuse bank address FB are compared with each other by the comparison circuit 311. When they match with each other, the match signal Repair_Match is output from the AND gate circuit 312.

The match signal Repair_Match is input to the multiplexer 402 shown in FIG. 5. In the soft-post-package-repair Undo operation, the enable signal UndoEnable has been activated to a high level and thus the multiplexer 402 selects the match signal Repair_Match. Accordingly, the fuse data bus [0] that transmits an enable bit is placed at a VSS level at the timing when the fuse bank address FB latched by the latch circuit 308 is selected. As a result, an address latch circuit that has been used for the soft-post-package repair is disabled. Even if the soft-post-package-repair Undo command is issued for a memory bank for which a soft-post-package repair has not been performed, the enable signal UndoEnable is not activated because the history signal DoneFlag is at a low level.

Figures 12A, 12B:
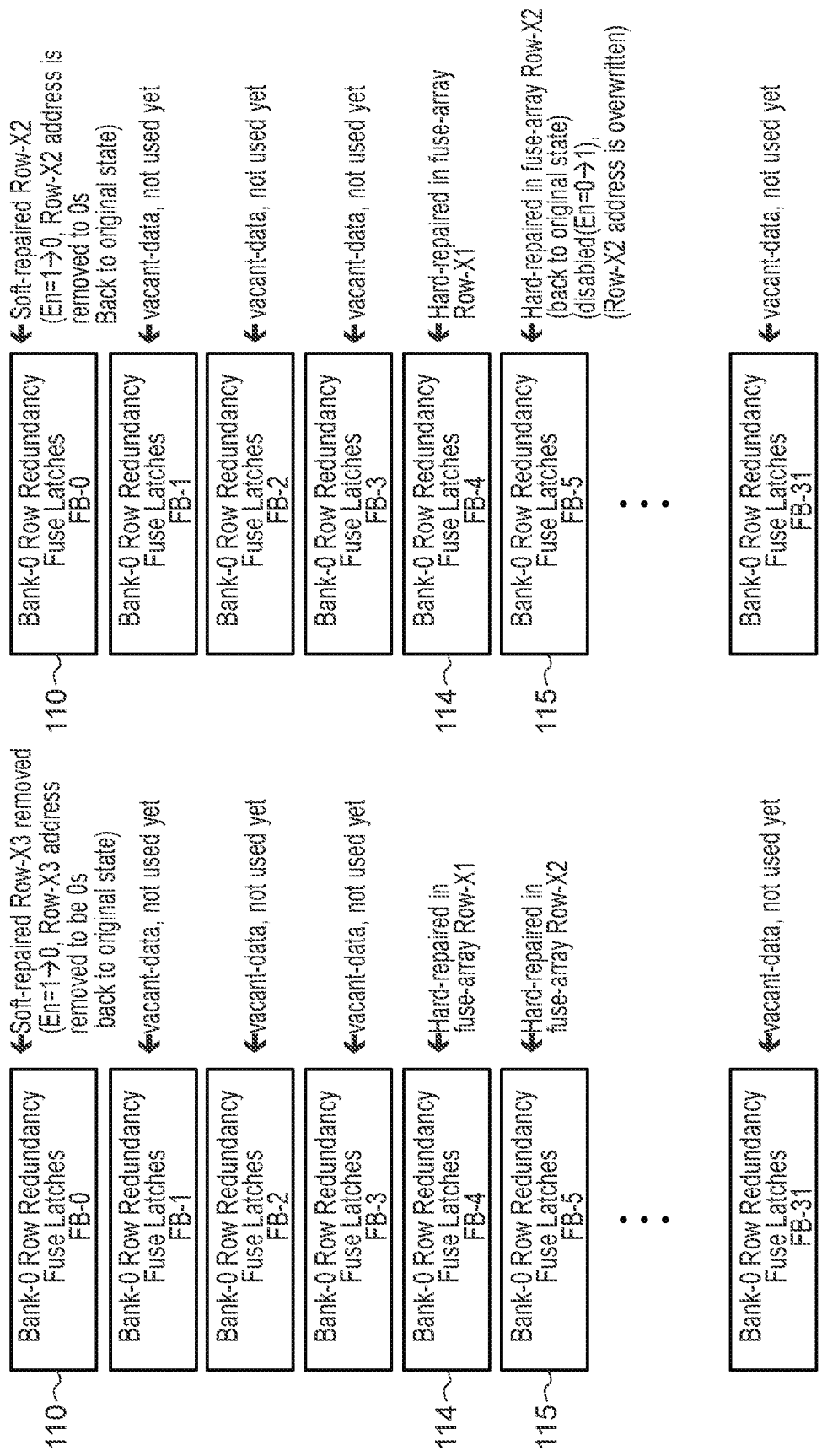
FIG. 12A and FIG. 12B are block diagrams showing an example of a state of the address latch circuit after a soft-post-package-repair Undo operation.

When the soft-post-package-repair Undo operation is completed, the address latch circuit that has been used for the soft-post-package repair is disabled as shown in FIG. 12A. In the example shown in FIG. 12A, the enable bit of the row address Row-X3 latched by the address latch circuit 110 is overwritten to a VSS level, so that the address latch circuit 110 is disabled. Except for this point, the state in FIG. 12A is the same as the state shown in FIG. 11A. As described above, when a soft-post-package-repair Undo command is executed, it is possible to return the current state to the state before a soft-post-package repair.

4-2. Soft-Post-Package-Repair Undo Operation (with Fail_Match)

In a case where the match signal Fail_Match has been activated in a soft-post-package-repair operation, the match signal Fail_Match is activated also in a soft-post-package-repair Undo operation. That is, when an address for which a soft-post-package repair is to be canceled and the fuse data FuseDataP[n−1:1] read out from the anti-fuse cell array 140 match with each other, the match signal XNORMatch is activated in the first anti-fuse_read operation, and the match signal Fail_Match is output in the second anti-fuse_read operation.

The match signal Fail_Match is input to the multiplexer 401 shown in FIG. 5. In the soft-post-package-repair Undo operation, since the enable signal UndoEnable has been activated to a high level, the multiplexer 401 selects the match signal Fail_Match. Accordingly, at the timing when the fuse bank address FB latched by the latch circuit 305 is selected, the row address [12:1] input from outside is output to the fuse data bus [12:1], and a VDD level is output to the fuse data bus [0].

As a result, as shown in FIG. 12B, an address latch circuit selected at the timing when the match signal Fail_Match is activated returns to an enable state, and an address latch circuit selected at the timing when the match signal Repair_Match is activated is disabled. In the example shown in FIG. 12B, the enable bit of the row address Row-X2 latched by the address latch circuit 115 is overwritten to the VDD level again, so that the address latch circuit 115 is enabled. Further, the enable bit of the row address Row-X2 latched by the address latch circuit 100 is overwritten to a VSS level, so that the address latch circuit 110 is disabled. As described above, even in a case where the match signal Fail_Match has been activated in a soft-post-package-repair operation, it is possible to return the current state to the state before the soft-post-package-repair operation by executing a soft-post-package-repair Undo command.

5. Lock Operation

A Lock operation is performed by inputting a Lock command to the command terminal 10 shown in FIG. 1 and inputting an address of a memory bank that is a target of this operation to the address terminal 20 shown in FIG. 2.

When a Lock command is input, the lock flag 320 shown in FIG. 4A is set. Accordingly, the lock flag LockFlag of the corresponding memory bank becomes high, and thus the match signal Repair_Match and the match signal Fail_Match are not activated. Therefore, even when a soft-post-package-repair command and a soft-post-package-repair Undo command are executed, the state of an address latch circuit is not changed. That is, a soft-post-package-repair operation and a soft-post-package-repair Undo operation are prohibited.

Further, the Lock command may be acceptable by the address, not by the memory bank. In this case, it is possible to prohibit a soft-post-package-repair operation and a soft-post-package-repair Undo operation by the address irrespective of whether a hard-post-package repair has been done, by performing operations identical to those in a soft-post-package repair also when the Lock command is input.

6. Note

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a first address generator configured to generate a first address in response to a clock signal;
a second address generator configured to generate a second address corresponding to the first address;
a first detection circuit configured to activate a first signal when the second address matches with a third address;
a second detection circuit configured to activate a second signal when the second address indicates a predetermined state;
a first latch circuit configured to latch the first address in response to the first signal;
a second latch circuit configured to latch the first address in response to the second signal;
a third detection circuit configured to activate a third signal when the first address matches with an address stored in the first latch circuit;
a fourth detection circuit configured to activate a fourth signal when the first address matches with an address stored in the second latch circuit; and
a first selector configured to select one of the third and fourth signals.

2. The apparatus of claim 1, further comprising a second selector configured to select one of at least a part of the second address and at least a part of the third address based on a signal selected by the first selector.

3. The apparatus of claim 2, wherein the first selector is configured to select the fourth signal in a first operation performed responsive to a first command.

4. The apparatus of claim 3, wherein the first operation is a soft-post-package-repair operation.

5. The apparatus of claim 4, wherein the first address corresponding to the second address having the predetermined state is not used.

6. The apparatus of claim 4, wherein the first selector is configured to select the third signal in a second operation.

7. The apparatus of claim 6, wherein the second operation is a soft-post-package-repair undo operation.

8. The apparatus of claim 7, wherein the third address is supplied from outside in the soft-post-package-repair or the soft-post-package-repair undo operations.

9. The apparatus of claim 2, wherein the part of the third address includes an enable bit.

10. The apparatus of claim 9, wherein the enable bit is disabled responsive to the third signal when the first selector selects the fourth signal.

11. The apparatus of claim 9, wherein the enable bit is disabled responsive to the fourth signal when the first selector selects the third signal.

12. The apparatus of claim 1, further comprising a lock circuit configured to deactivate the third and fourth signals regardless of an operation of the third and fourth detection circuits.

13. The apparatus of claim 12, wherein the lock circuit is activated responsive to a lock command.

14. The apparatus of claim 1, wherein the first address generator is configured to increment or decrement the first address each time the clock signal is activated.

15. The apparatus of claim 1, wherein the second address generator includes an anti-fuse cell array storing the second address.

16. An apparatus comprising:
an anti-fuse cell array configured to store a plurality of first addresses;
a fuse data bus coupled to the anti-fuse cell array;
a first circuit configured to activate a first signal when a selected one of the plurality of first addresses is not used for a soft-post-package-repair operation;
a second circuit configured to output a second address instead of the selected one of the plurality of first addresses to the fuse data bus when the first signal is activated in the soft-post-package-repair operation; and
a third circuit configured to disable the selected one of the plurality of first addresses to be on the fuse data bus when the first signal is activated in a soft-post-package-repair undo operation.

17. The apparatus of claim 16, further comprising a fourth circuit configured to activate a second signal when the selected one of the plurality of first addresses matches with the second address, wherein the third circuit is further configured to disable the selected one of the plurality of first addresses to be on the fuse data bus when the second signal is activated in the soft-post-package-repair operation.

18. The apparatus of claim 17, wherein the second circuit is further configured to output the second address instead of the selected one of the plurality of first addresses to the fuse data bus when the second signal is activated in the soft-post-package-repair undo operation.

19. The apparatus of claim 17, further comprising a fifth circuit configured to deactivate the first and second signals regardless of an operation of the first and fourth detection circuits.

20. An apparatus comprising:
an anti-fuse cell array configured to store a plurality of first addresses;
a fuse data bus configured to convey a selected one of the plurality of first addresses;
a first circuit configured to activate a first signal when the selected one of the plurality of first addresses matches with a second address;
a second circuit configured to output the second address instead of the selected one of the plurality of first addresses to the fuse data bus when the first signal is activated during a soft-repair undo operation; and
a third circuit configured to disabled the selected one of the plurality of first addresses on the fuse data bus when the first signal is activated during a soft-repair operation.

* * * * *